(12) United States Patent
Hoeppel et al.

(10) Patent No.: US 10,453,989 B2
(45) Date of Patent: Oct. 22, 2019

(54) METHOD FOR PRODUCING A PLURALITY OF SEMICONDUCTOR CHIPS AND SEMICONDUCTOR CHIP

(71) Applicant: OSRAM Opto Semiconductors GmbH, Regensburg (DE)

(72) Inventors: Lutz Hoeppel, Alteglofsheim (DE); Alexander F. Pfeuffer, Regensburg (DE); Dominik Scholz, Regensburg (DE); Isabel Otto, Regensburg (DE); Norwin Von Malm, Nittendorf (DE); Stefan Illek, Donaustauf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 106 days.

(21) Appl. No.: 15/552,259

(22) PCT Filed: Feb. 15, 2016

(86) PCT No.: PCT/EP2016/053148
§ 371 (c)(1),
(2) Date: Aug. 18, 2017

(87) PCT Pub. No.: WO2016/131761
PCT Pub. Date: Aug. 25, 2016

(65) Prior Publication Data
US 2018/0069147 A1  Mar. 8, 2018

(30) Foreign Application Priority Data

Feb. 20, 2015 (DE) .................. 10 2015 102 458

(51) Int. Cl.
*H01L 21/76* (2006.01)
*H01L 33/00* (2010.01)
(Continued)

(52) U.S. Cl.
CPC .......... *H01L 33/0079* (2013.01); *H01L 21/02* (2013.01); *H01L 33/486* (2013.01); *H01L 2221/67* (2013.01); *H01L 2933/0033* (2013.01)

(58) Field of Classification Search
CPC ............... H01L 21/02; H01L 21/02076; H01L 21/30604; H01L 21/563; H01L 21/568;
(Continued)

(56) References Cited

U.S. PATENT DOCUMENTS 8,664,043 B2 * 3/2014 Ewe ..................... H01L 23/5389
438/110
2005/0067680 A1 * 3/2005 Boon .................. H01L 21/4846
257/678

(Continued)

FOREIGN PATENT DOCUMENTS

DE     102012111358 A1    5/2014
DE     102014109571 A1    1/2015
EP          2667422 A2    11/2013

*Primary Examiner* — Brook Kebede
(74) *Attorney, Agent, or Firm* — McDermott Will & Emery LLP

(57) ABSTRACT

Disclosed is a method for producing a plurality of semiconductor chips (10). A composite (1), which comprises a carrier (4) and a semiconductor layer sequence (2, 3), is provided. Separating trenches (17) are formed in the semiconductor layer sequence (2, 3) along an isolation pattern (16). A filling layer (11) limiting the semiconductor layer sequence (2, 3) toward the separating trenches (17) is applied to a side of the semiconductor layer sequence (2, 3) facing away from the carrier (4). Furthermore, a metal layer (10) adjacent to the filling layer (11) is applied in the separating trenches (17). The semiconductor chips (20) are isolated by removing the metal layer (10) adjacent to the filling layer (11) in the separating trenches (17). Each isolated semiconductor chip (20) has one part of the semi-
(Continued)

conductor layer sequence (2, 3), and of the filling layer (11). Also disclosed is a semiconductor chip (10).

12 Claims, 4 Drawing Sheets

(51) Int. Cl.
*H01L 33/48* (2010.01)
*H01L 21/02* (2006.01)

(58) Field of Classification Search
CPC . H01L 21/6835; H01L 21/6836; H01L 21/78; H01L 21/784; H01L 24/96; H01L 33/0079; H01L 33/486
USPC .......................................... 438/113, 114, 454
See application file for complete search history.

(56) References Cited

U.S. PATENT DOCUMENTS

| | | |
|---|---|---|
| 2008/0029847 A1 | 2/2008 | Guillermo et al. |
| 2014/0042450 A1 | 2/2014 | Akiyama et al. |

\* cited by examiner

METHOD FOR PRODUCING A PLURALITY OF SEMICONDUCTOR CHIPS AND SEMICONDUCTOR CHIP

A method for producing a plurality of semiconductor chips and a semiconductor chip are provided.

This patent application claims priority from German patent application 10 2015 102 458.6, the disclosure content of which is hereby included by reference.

To produce a plurality of semiconductor chips from semiconductor wafers, in particular to singulate the semiconductor wafers into semiconductor chips, various methods may be applied which in particular dice the substrate material. The efficiency of most singulation methods depends greatly, however, on constraints which limit the yield of the semiconductor wafer.

One object is to provide a method which contributes to producing a semiconductor chip simply and efficiently.

A method is provided for producing a plurality of semiconductor chips. The semiconductor chips may in particular be optoelectronic semiconductor chips, such as for example light-emitting diode chips or photodiode chips.

In at least one embodiment of the method, a composite structure is provided. The composite structure extends in a vertical direction between a first major face and a second major face of the composite structure, wherein the vertical direction may extend perpendicularly to the first and/or second major face. The major faces may for example be the top surface and the bottom surface of the composite structure. The method relates in particular to singulation of the composite structure into a plurality of semiconductor chips along a singulation pattern. Singulation proceeds in particular perpendicularly to the first and/or second major face, for example at least in places in the vertical direction.

For example, the singulation pattern may be grid-shaped, in the manner of a regular polygonal grid. Singulation does not necessarily have to proceed along straight lines. Instead, singulation may also produce semiconductor chips having side faces, resulting from singulation, which are curved at least in places or have at least one bend when viewed in plan view.

In at least one embodiment of the method, the composite structure comprises a carrier. The carrier consists for example of sapphire or a semiconductor material, for instance silicon, germanium, gallium phosphide or gallium arsenide or contains such a material. The carrier may be electrically conductive or electrically insulating.

In at least one embodiment of the method, the composite structure comprises a semiconductor layer sequence. The semiconductor layer sequence is for example deposited epitaxially, for instance by means of sputtering, MOVPE, MOCVD or MBE. The semiconductor layer sequence may be deposited on the carrier or on a growth substrate other than the carrier. For example, the semiconductor layer sequence comprises an active region provided for generating radiation and/or for receiving radiation.

The semiconductor layer sequence, in particular the active region, for example contains a III-V compound semiconductor material. III-V compound semiconductor materials are particularly suitable for generating radiation in the ultraviolet ($Al_x In_y Ga_{1-x-y} N$) through the visible ($Al_x In_y Ga_{1-x-y} N$, in particular for blue to green radiation, or $Al_x In_y Ga_{1-x-y} P$, in particular for yellow to red radiation) as far as into the infrared ($Al_x In_y Ga_{1-x-y} As$) region of the spectrum. Here in each case $0 \leq x \leq 1$, $0 \leq y \leq 1$ and $x+y \leq 1$ applies, in particular with $x \neq 1$, $y \neq 1$, $x \neq 0$ and/or $y \neq 0$. Using III-V compound semiconductor materials, in particular from the stated material systems, it is additionally possible to achieve high internal quantum efficiencies in the generation of radiation.

The first major face is located in particular on the side of the semiconductor layer sequence remote from the carrier. The second major face is accordingly located in particular on the side of the carrier remote from the semiconductor layer sequence.

In at least one embodiment of the method, dicing trenches are formed in the semiconductor layer sequence, in particular along the singulation pattern. The dicing trenches may for example be formed mechanically, such as for instance by sawing, by means of a laser and/or plasma dicing method, or by a chemical method.

In at least one variant embodiment of the method, the dicing trenches are formed such that a side face of the semiconductor layer sequence delimiting the respective dicing trench is substantially planar. In other words, the gradient of the side face delimiting the respective dicing trench is substantially constant. The side face thus for example does not comprise any macroscopic raised portions or depressions.

In at least one further variant embodiment of the method the dicing trenches are configured such that the side face of the semiconductor layer sequence delimiting the respective dicing trench comprises at least one step. In other words, the gradient of the side face delimiting the respective dicing trench changes abruptly.

In at least one embodiment of the method, a filling layer delimiting the semiconductor layer sequence relative to the dicing trenches is applied to a side of the semiconductor layer sequence remote from the carrier.

After application the filling layer extends in the lateral direction at least in part over the first major face. In the singulated semiconductor chips the side faces of the filling layer in particular form the side faces delimiting the semiconductor chip in the lateral direction.

The lateral direction is understood to mean a direction which extends along a main plane of extension of the semiconductor layers of the semiconductor layer sequence. The lateral directions may for example extend parallel to the first and/or second major face.

The filling layer is in particular a potting compound, which may also be designated a molding composition or "mold compound". This is for example an epoxy resin, which may be filled with particles of further materials. The filling layer then for example comprises a high concentration of $SiO_2$ beads, wherein the concentration relates to a proportion by weight. In particular, the concentration of $SiO_2$ beads may amount to between 80% and 90%.

The $SiO_2$ beads are almost perfectly spherical particles of pure $SiO_2$, the diameter of which may amount to between 1 µm and 100 µm. The $SiO_2$ beads are distinguished in particular in that they are inert and have a very low coefficient of thermal expansion (CTE~0.5 ppm/K). In this way, the coefficient of thermal expansion of the filling layer consisting of epoxy resin and the particles may be reduced to around 10 ppm/K (resins without said particles generally have a CTE>>100 ppm/K).

Alternatively, the particles may for instance be formed of $Si_3N_4$, $Al_2O_3$ or $TiO_2$. In this context, however, the coefficient of thermal expansion of the filling layer may be reduced to a lesser degree.

In at least one embodiment of the method, a metal layer adjoining the filling layer is applied in the dicing trenches.

After application the metal layer extends in the lateral direction at least in part over the first major face. In the region of the filling layer the metal layer in this case has at least one dividing line at which the metal layer is completely interrupted. To this end, the metal layer is for example applied in patterned manner using photoresist, in particular prior to application of the filling layer.

The metal layer is moreover in particular applied in such a way that the dicing trenches are completely filled, within the bounds of manufacturing tolerances. The metal layer in a respective dicing trench may also be referred to as a dicing strip. The metal layer in the dicing trenches serves in particular in mechanical connection of the plurality of semiconductor chips or for mechanical stabilization of the composite structure.

The metal layer may in particular comprise one or more sublayers. For example, at least one first sublayer of the metal layer may be applied by means of a physical vapor deposition process (PVD). In addition, at least one second sublayer of the metal layer may be applied by electrodeposition. In this connection, the first sublayer may in particular be used for supplying power for electrodeposition of the second sublayer.

In at least one embodiment of the method, the semiconductor chips are singulated by removing the metal layer, adjoining the filling layer, from the dicing trenches.

The metal layer is in particular removed along the singulation pattern. The metal layer may for example be removed mechanically, for instance by sawing, by means of a laser and/or plasma dicing method, or by a chemical method.

In at least one embodiment of the method, the singulated semiconductor chips each comprise part of the semiconductor layer sequence and of the filling layer. In the semiconductor chips singulated from the composite structure, the filling layer in each case surrounds the semiconductor layer sequence in the lateral direction.

In at least one embodiment of the method, a composite structure is provided which comprises a carrier and a semiconductor layer sequence. In the semiconductor layer sequence dicing trenches are formed along a singulation pattern. A filling layer delimiting the semiconductor layer sequence relative to the dicing trenches is applied on a side of the semiconductor layer sequence remote from the carrier. In addition, a metal layer adjoining the filling layer is applied in the dicing trenches. The semiconductor chips are singulated by removing the metal layer adjoining the filling layer from the dicing trenches. The semiconductor chips singulated from the composite structure each comprise a part of the semiconductor layer sequence and of the filling layer.

For example, the dicing trenches are here formed in a first step. Then the metal layer is firstly applied in a second step and in a subsequent third step the filling layer is applied. In a final fourth step the metal layer may then be removed and the composite structure thereby singulated into semiconductor chips.

Using the described method the composite structure may be diced simply, efficiently and gently. The fact that the metal layer in the dicing trenches is delimited in the lateral direction by the filling layer allows the dicing street for singulation of the semiconductor chips to be particularly narrow. This advantageously results in high utilization of the surface of the composite structure by the semiconductor chips. In addition, by removing the metal layer during singulation of the composite structure into semiconductor chips, material loading of the semiconductor chips may be kept low, so as to ensure a low scrap rate. The method thus contributes to a particularly high yield when producing the semiconductor chips.

In at least one embodiment of the method, the composite structure is attached to an auxiliary carrier prior to singulation. After singulation, the semiconductor chips are present on the auxiliary carrier in a geometric arrangement. Examples of suitable auxiliary carriers are a film, a rigid carrier or a board onto which the semiconductor chips, whether still located in the composite structure or already singulated, are sucked by a vacuum or fixed by means of electrostatic forces. After singulation, the semiconductor chips may be present on the auxiliary carrier in a geometric arrangement, for example in a matrix-like pattern. Further processing of the semiconductor chips is simplified thereby.

In at least one embodiment of the method, the metal layer is additionally applied on a side of the filling layer remote from the dicing trenches on a side of the semiconductor layer sequence remote from the carrier. In particular, the metal layer arranged on the side of the filling layer remote from the dicing trenches serves as a through-via for electrical contacting of the semiconductor layer sequence from the first major face.

In at least one variant embodiment of the method, the metal layer is here configured for contacting a single semiconductor layer of the semiconductor layer sequence. In this context, the metal layer extends for example in the lateral direction substantially over the entire surface of the semiconductor layer sequence.

In at least one further variant embodiment of the method, the metal layer is configured for contacting multiple semiconductor layers of the semiconductor layer sequence, in particular two semiconductor layers. In this context the metal layer is in particular completely interrupted, such that isolated electrical contacting is ensured.

In at least one embodiment of the method the metal layer is applied at least in part by an electroplating method.

In this context, the metal layer comprises at least two sublayers, wherein the first sublayer is used to supply power during application of the second sublayer. The first sublayer is in this case applied for example by means of a physical vapor deposition process and comprises by way of example a material such as gold, copper or nickel, or consists of one of these materials. The first sublayer may also be referred to as a "seed layer" or, as hereinafter, as a starting layer.

The second sublayer is applied by electroplating and for example comprises a material such as copper or nickel, or consists of one of these materials. The second sublayer may also be designated as hereinafter as electroplating. The thickness of the second sublayer in the vertical direction is in particular greater than that of the first sublayer.

In at least one embodiment of the method, the metal layer adjoining the filling layer is removed from the dicing trenches using a chemical method.

Advantageously, this enables parallel, efficient singulation of the composite structure into semiconductor chips. In particular, a wet chemical method may be used for this purpose. In this context, the filling layer is particularly resistant to the chemical method.

In at least one variant embodiment of the method, only one etchant is used in the chemical method. In the case of the metal layer comprising a single layer, the chemical method may in this way be performed particularly rapidly. For example, in the case of a metal layer formed from copper, an $FeCl_3$-based solution or a $CuCl_2$-based solution may be used as etchant. In the case, for example, of a metal layer formed from nickel, one of $HNO_3$, $H_2SO_4$, $CH_3COOH$, $H_2O_2$, or a mixture thereof may be used as etchant.

In at least one further variant embodiment of the method, a plurality of etchants may be used in the chemical method.

In the case of the metal layer comprising multiple sublayers, the chemical method may be performed particularly efficiently and reliably. For example, a first sublayer formed from gold may act as an etch stop for a second sublayer formed from copper or nickel. To remove the first sublayer formed of gold, "Surpro" may for example be used.

In at least one embodiment of the method, the dicing trenches are formed using a chemical method. This advantageously enables parallel formation of the dicing trenches, so as to contribute to efficient singulation of the composite structure into semiconductor chips. The chemical method for example comprises plasma etching ("chemical dry etching", CDE).

In at least one embodiment of the method, the dicing trenches extend right through the semiconductor layer sequence. A load-bearing structure of the composite structure is thus formed merely by the carrier after formation of the dicing trenches. Advantageously, singulation of the semiconductor chips may in this way be performed substantially independently of the material of the semiconductor layer sequence, the number of layers of the semiconductor layer sequence and the extent of the semiconductor layer sequence in the vertical direction.

In at least one embodiment of the method, detachment of the carrier is performed in an additional step. The semiconductor chips may then for example be "thin-film semiconductor chips", from which the growth substrate for the semiconductor layer sequence has been removed. In particular, in this context the filling layer serves as a carrier body for the respective semiconductor chips to provide mechanical stabilization. Detachment of the carrier proceeds for this purpose in particular after application of the filling layer delimiting the semiconductor layer sequence relative to the dicing trenches on the side of the semiconductor layer sequence remote from the carrier.

In at least one embodiment of the method, the carrier is detached after the dicing trenches have been formed in the semiconductor layer sequence along the singulation pattern. The carrier here serves in particular as a load-bearing structure for mechanical stabilization of the composite structure, such that the semiconductor chips are arranged in a geometric arrangement even once the dicing trenches have been completely formed.

In at least one embodiment of the method, the filling layer delimiting the semiconductor layer sequence relative to the dicing trenches is applied on the side of the semiconductor layer sequence remote from the carrier after application of the metal layer, delimiting the filling layer, in the dicing trenches. In other words, the filling layer is thus applied after the metal layer. In this context, for example, the metal layer or a sublayer thereof is applied in patterned manner using photoresist. The photoresist may then be removed and replaced by the filling layer.

In at least one embodiment of the method, the metal layer adjoining the filling layer is removed from the dicing trenches after detachment of the carrier. In other words, after detachment of the carrier, the composite structure of the semiconductor chips is mechanically stabilized merely by the dicing strip, i.e. by the metal layer in the dicing trenches.

A semiconductor chip is furthermore provided. The semiconductor chip may be produced in particular using a method described here, such that all of the features disclosed for the method are also disclosed for the semiconductor chip and vice versa.

In at least one embodiment, the semiconductor chip comprises a semiconductor layer sequence and a filling layer, which is arranged in a vertical direction on the semiconductor layer sequence and which delimits the semiconductor layer sequence relative to a side face of the semiconductor chip. On the side face of the semiconductor chip the filling layer displays traces of material removal performed using a chemical method.

To produce such a semiconductor chip, patterning of the semiconductor chips, in particular dicing of the semiconductor layer sequence, may proceed on a growth substrate. The feature according to which the filling layer displays traces of material removal using a chemical method on one side face of the semiconductor chip is an objective feature which is unambiguously detectable on the finished semiconductor chip using analytical methods used in semiconductor technology. These traces are for example unambiguously distinguishable from traces which may be produced by sawing, breaking, laser cutting or other dicing techniques. The stated feature is thus in particular not a method feature.

In at least one embodiment of the semiconductor chip, a metal layer for electrical contacting of the semiconductor layer sequence is arranged in the vertical direction on the semiconductor layer sequence and is delimited in a horizontal direction by the filling layer. For this purpose, the metal layer is in particular configured as a through-via for electrical contacting of the semiconductor chip from the first major face. In this context, the semiconductor chip for example comprises an electrical contact for external electrical contacting of the semiconductor chip in the vertical direction on the side of the metal layer remote from the semiconductor layer sequence.

In at least one variant embodiment, the metal layer is here configured for contacting a single semiconductor layer of the semiconductor layer sequence. In this context, the metal layer extends for example in the lateral direction substantially over the entire surface of the semiconductor layer sequence.

In at least one further variant embodiment, the metal layer is configured for contacting multiple semiconductor layers of the semiconductor layer sequence, in particular two semiconductor layers. In this context the metal layer is in particular completely interrupted, such that isolated electrical contacting is ensured.

In at least one embodiment, the metal layer is interrupted by part of the filling layer in such a way that the semiconductor layer sequence is separately electrically contactable by the metal layer. In this connection, the semiconductor chip for example in each case comprises an electrical contact for separate external electrical contacting of the semiconductor chip in the vertical direction on the side of the metal layer remote from the semiconductor layer sequence. The part of the filling layer interrupting the metal layer is then in particular of electrically insulating configuration.

In at least one embodiment, the metal layer takes the form of a mechanically stabilizing layer for the semiconductor chip. The modulus of elasticity of the metal layer is in this context higher than the modulus of elasticity of the semiconductor layer sequence.

In at least one embodiment, the filling layer takes the form of a mechanically stabilizing layer for the semiconductor chip. The modulus of elasticity of the filling layer is in this context higher than the modulus of elasticity of the semiconductor layer sequence.

Further features, configurations and aspects are revealed by the following description of the exemplary embodiments in conjunction with the figures, in which.

Figure 1A:
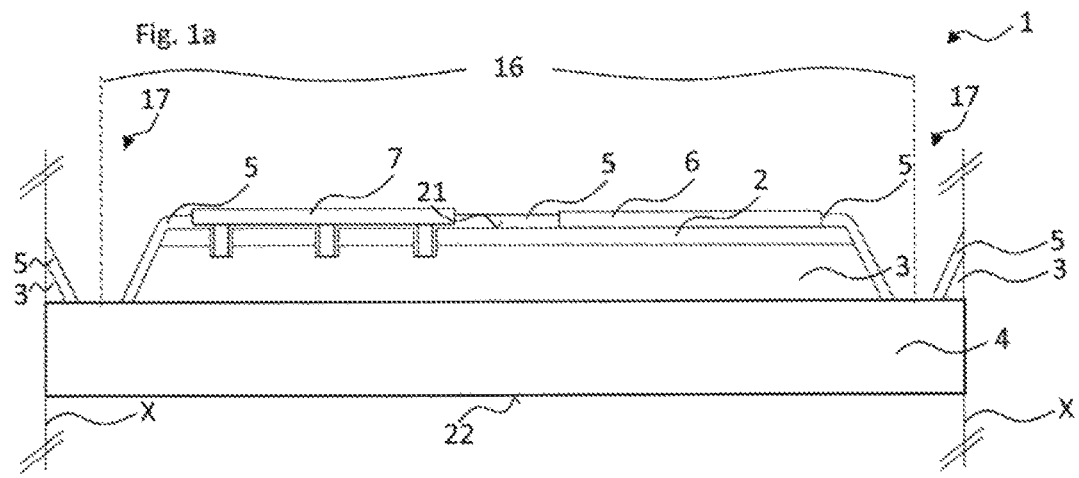
FIGS. 1a to 1h show a first exemplary embodiment of a method for producing a plurality of semiconductor chips on the basis of intermediate method steps each shown in schematic sectional view.

Identical, similar or identically acting elements are provided with the same reference numerals in the figures. The figures and the size ratios of the elements illustrated in the figures relative to one another are not to be regarded as being to scale. Rather, individual elements and in particular layer thicknesses may be illustrated on an exaggeratedly large scale for greater ease of depiction and/or better comprehension.

A first exemplary embodiment of a method for producing a plurality of semiconductor chips is shown with reference to FIGS. 1a to 1h, in each case in schematic sectional view. As shown in FIG. 1a, a composite structure 1 is provided, which is provided for singulation into a plurality of semiconductor chips 20 (see FIG. 1h). The semiconductor chips 20 are for example optoelectronic semiconductor chips, with an active region provided for generating and/or receiving radiation (not shown explicitly in the figures for simplicity's sake). In the first exemplary embodiment shown in FIG. 1a, the composite structure 1 comprises a semiconductor layer sequence 2, 3 and a carrier 4. The semiconductor layer sequence 2, 3 has here been subdivided in a singulation pattern 16 into a plurality of semiconductor bodies by means of dicing trenches 17. The dicing trenches 17 may also be referred to as "mesa trenches".

The singulation pattern 16 may for example comprise a grid structure with first singulation lines in a first direction and with second singulation lines which extend obliquely or perpendicularly to the first singulation lines. The singulation pattern 16 may however also be curved at least in places or be configured such that the subsequently singulated semiconductor chips 20, when viewed in plan view, have a basic shape with more or fewer than four corners, for example a hexagonal basic shape.

Further semiconductor bodies are indicated schematically in a main direction of extension of the composite structure 1. The section lines X here merely symbolize the lateral boundary of FIG. 1a and in particular do not delimit the composite structure 1 with these semiconductor bodies.

In this exemplary embodiment the semiconductor layer sequence 2, 3 comprises a p-doped GaN layer 2 and an n-doped GaN layer 3. In other exemplary embodiments the semiconductor layer sequence 2, 3, in particular the active region, contains one of the compound semiconductor materials mentioned in the general part of the description.

The carrier 4 comprises a growth substrate for epitaxial deposition of the semiconductor layer sequence 2, 3, such as for example sapphire. At variance therewith, the carrier 4 may for example contain a semiconductor material, for instance silicon or germanium. Another semiconductor material such as gallium phosphide or gallium arsenide may also be used. The carrier 4 in this case mechanically stabilizes the semiconductor layer sequence 2, 3.

In a vertical direction, the composite structure 1 extends between a first major face 21 and a second major face 22. The first major face 21 is formed by the semiconductor layer sequence 2, 3. The second major face 22 is formed by the carrier 4.

In this exemplary embodiment, the semiconductor layer sequence 2, 3 is covered up to the first major face 21 in part by an insulation layer 5. In other exemplary embodiments, a surface of the carrier 4 facing the first major face 21 is additionally or alternatively covered by the insulation layer 5 in a region of the dicing trenches 17. The insulation layer 5 for example comprises silicon nitride.

In this exemplary embodiment, moreover, a first contact plate 6 for electrical contacting of the p-doped GaN layer 2 is arranged on the side of the semiconductor layer sequence 2, 3 facing the first major face 21. The first contact plate 6 may also be referred to as a "p-pad". Furthermore, a second contact plate 7 for electrical contacting of the n-doped GaN layer 3 is arranged on the side of the semiconductor layer sequence 2, 3 facing the first major face 21. The second contact plate 7 may also be referred to as an "n-pad".

In addition, the composite structure 1 may for example comprise one or more functional layers not shown in any greater detail, such as for example a bonding layer, for instance a solder layer or an electrically conductive adhesive layer. The functional layer may furthermore comprise a metallic mirror layer for the radiation to be generated or absorbed in the semiconductor layer sequence 2, 3. The functional layer may for example further comprise a layer for electrical contacting or for current spreading. Alternatively or in addition, the functional layer may also comprise a dielectric layer.

The dicing trenches 17 extend vertically right through the semiconductor layer sequence 2, 3. Furthermore, the dicing trenches 17 extend vertically right through the for example additionally arranged functional layers.

In the following figures, only one portion of the composite structure 1 along the singulation pattern 16 is depicted, for reasons of clarity.

Figure 1B:
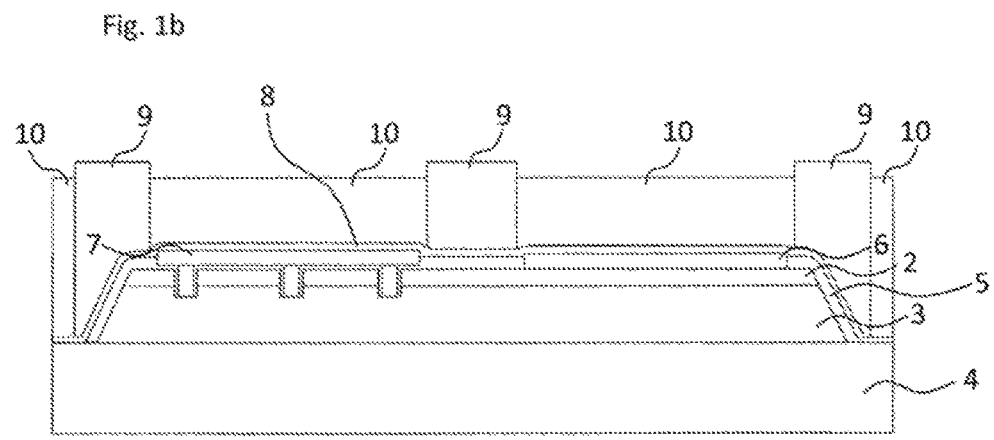

As depicted in FIG. 1b, a starting layer 8 is applied over the surface of the composite structure 1 from the first major face 21. The starting layer 8 is formed from a conductive material, in particular a metal such as gold, copper or nickel. In this exemplary embodiment the starting layer 8 is formed from gold. The starting layer 8 is here applied for example by means of a physical vapor deposition process.

A photoresist 9 is then applied to the composite structure 1 from the first major face 21 in such a way that the semiconductor layer sequence 2, 3 is delimited by the photoresist 9 relative to the dicing trenches 17. Then, electroplating 10 is applied to the composite structure 1 from the first major face 21 with the assistance of the photoresist 9 and patterned such that, after this step, the electroplating extends over the surface of the contact plates 6, 7 and fills the dicing trenches 17 at least in one region of the singulation pattern 16. The electroplating 10 is here formed from a metal such as copper or nickel. The electroplating 10 is applied galvanically, the starting layer 8 in particular being used in this connection to supply power.

The electroplating 10 extending over the contact plates 6, 7 and a part of the starting layer 8 arranged there may also be referred to as a through-via. The electroplating 10 arranged in the dicing trenches 17 and a part of the starting layer 8 arranged there may also be referred to as a dicing strip.

Figure 1C:
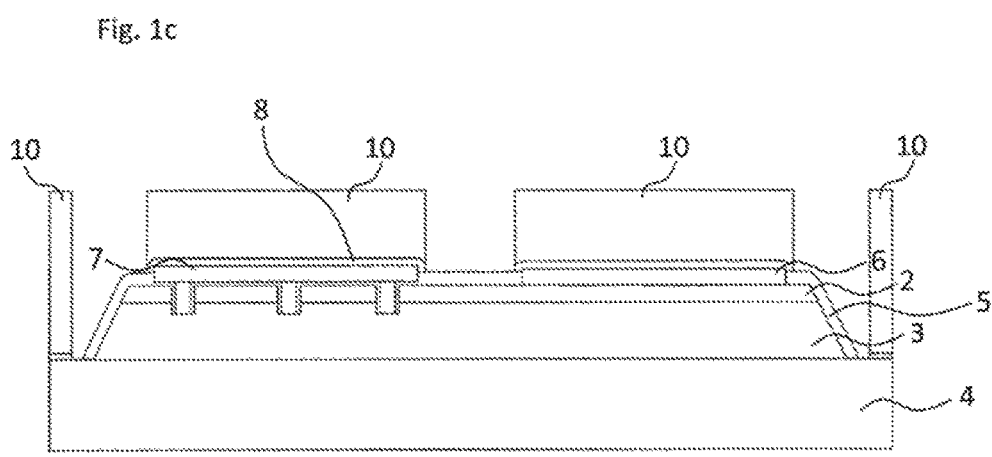

As depicted in FIG. 1c, the photoresist 9 (see FIG. 1b) is removed. Furthermore, a part of the starting layer 8 arranged at these points is removed therefrom. Advantageously, this serves in insulating the contact plates 6, 7 electrically from one another. Furthermore, the electroplating 10 arranged in the dicing trenches 17 is insulated electrically from the contact plates 6, 7. A wet chemical method is preferably used in this context. To remove the starting layer 8 formed of gold, "Surpro" may for example be used, which is selectively etching and is therefore particularly gentle with regard to the material of the composite structure 1.

Figure 1D:
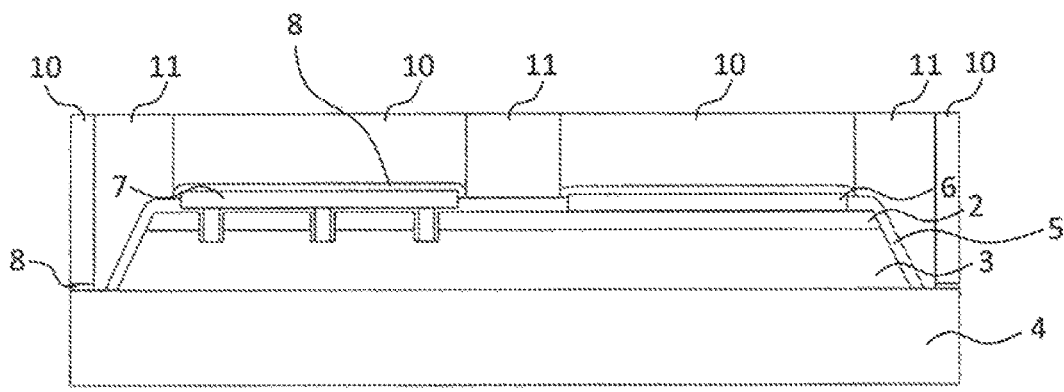

As depicted in FIG. 1d, a potting compound 11 is applied extensively over the composite structure 1 from the first major face 21. The potting compound 11 in particular fills the volume left by the photoresist 9 (see FIG. 1b) after removal. The potting compound 11 preferably comprises an epoxy resin with a high concentration of $SiO_2$ beads of between 80% and 90% based on a proportion by weight of the potting compound 11. The potting compound 11 is firstly thermally cured.

To planarize the composite structure 1 and for electrical contacting of the semiconductor chips 20, the potting compound 11 is then ground back from the first major face 21. After this step, the potting compound 11 surrounds the semiconductor layer sequence 2, 3 laterally and in particular delimits the latter relative to the dicing trenches 17. In particular, the potting compound 11 directly adjoins the dicing strips in the lateral direction. Furthermore, the potting compound 11 fills a space in the electroplating 10 between the contact plates 6, 7. Advantageously, the potting compound 11 in this region serves in mechanical stabilization of the semiconductor chips 20 and electrical insulation of the through-via.

Figure 1E:
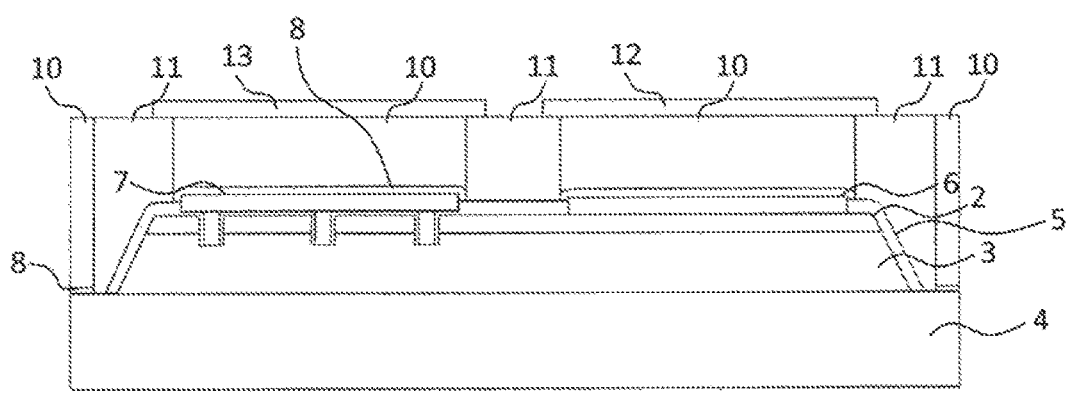

As depicted in FIG. 1e, a first connection contact 12 and a second connection contact 13 are plated onto the composite structure 1 from the first major face 21, for example using a photo method. The connection contacts 12, 13 are formed for example from gold, titanium, nickel, palladium or platinum. The first connection contact 12 here serves in electrical contacting of the first contact plate 6 via the corresponding through-via, i.e. the electroplating 10 arranged vertically therebetween and the part of the starting layer 8 arranged there. The second connection contact 13 likewise serves in electrical contacting of the second contact plate 7 via the corresponding through-via, i.e. the electroplating 10 arranged vertically therebetween and the part of the starting layer 8 arranged there.

Figure 1F:
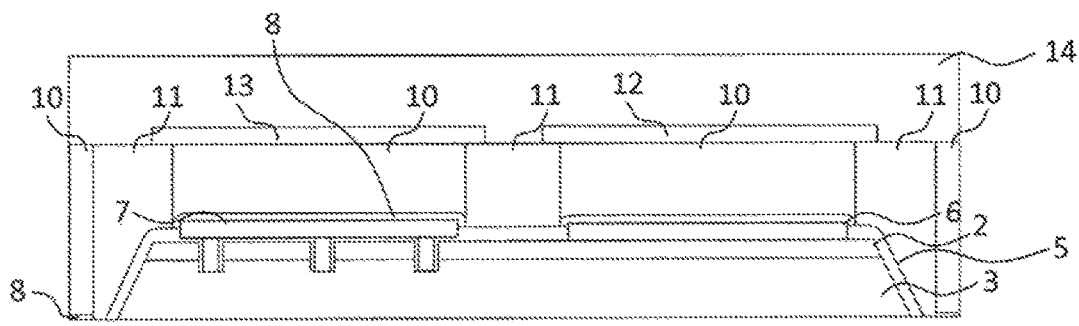

As shown in FIG. 1f, the composite structure 1 is attached to an auxiliary carrier 14 from the first major face 21. The auxiliary carrier 14 may for example be a film mounted to a frame. Alternatively, the auxiliary carrier 14 may also be a rigid carrier or a device in which the composite structure 1 and in particular the subsequently singulated semiconductor chips 20 are fixed by a vacuum or by means of electrostatic forces. The carrier 4 is then detached, for example by means of "laser lift-off".

Figure 1G:
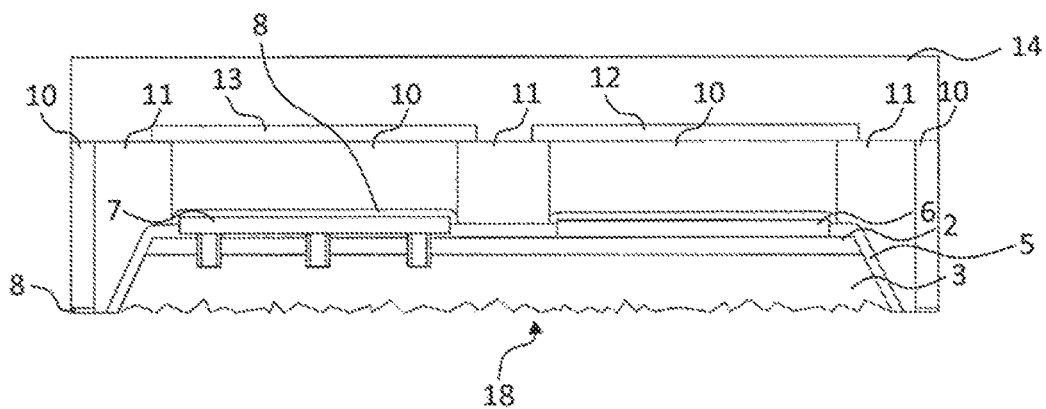

Depending on the nature of the carrier 4, the semiconductor layer sequence 2, 3 is then roughened, as shown in FIG. 1g, from the second major face 22, such that the latter exhibits roughening 18. In this case, a side of the n-doped GaN layer 3 remote from the auxiliary carrier 14 is roughened.

If the carrier 4 is a planar growth substrate, a wet chemical method may for example be used for this purpose, for example using potassium hydroxide, or a dry chemical method, for example using a lithography step. If the carrier 4 is a patterned growth substrate such as for example a patterned sapphire substrate (PSS), roughening of the semiconductor layer sequence 2, 3 may, on the other hand, be omitted.

Figure 1H:
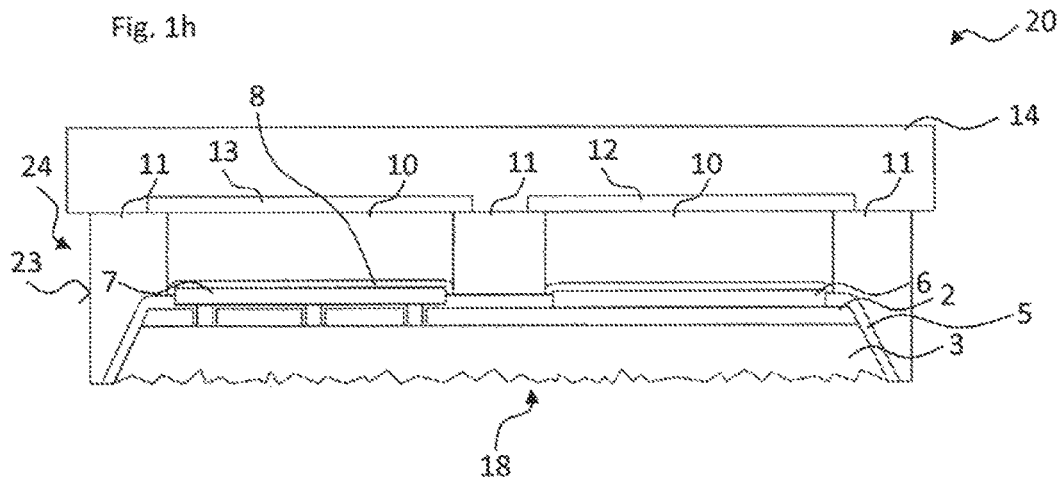

As shown in FIG. 1h, the semiconductor chips 20 are singulated by removing the dicing strips, i.e. the starting layer 8 in the dicing trenches 17 and the electroplating 10, surrounding the potting compound 11, in the dicing trenches 17. An etchant used for this purpose is in particular selective with regard to the electroplating 10 and the connection contacts 12, 13. Furthermore, the etchant is in particular selective with regard to the electroplating 10 and the potting compound 11.

The dicing strips are in particular removed wet chemically. A selective etchant for electroplating 10 formed from nickel may for example contain or consist of at least one of $HNO_3$, $H_2SO_4$, $CH_3COOH$, $H_2O_2$, or a mixture thereof. A selective etchant for electroplating 10 formed of copper may for example be an $FeCl_3$-based solution or a $CuCl_2$-based solution.

The wet chemical removal of the dicing strips enables parallel, inexpensive and damage-free singulation of the composite structure 1 into semiconductor chips 20 with particularly narrow dicing streets. In the case in particular of unilateral contacting of the semiconductor chips 20 from the first major face 21, application of the potting compound 11 and of the electroplating 10 is necessary for mechanical stabilization of the semiconductor chips 20, such that additional effort needed for singulation of the composite structure is particularly low. Chemical removal of the dicing strips formed from metal is advantageously particularly simple to perform.

The dicing strips may in this context in particular be of particularly narrow construction. By means of the auxiliary carrier 14, the singulated semiconductor chips 20 may be present in a geometric arrangement, for example in the form of a matrix. This simplifies further processing.

The potting compound 11 of the semiconductor chips 20 singulated in this way delimits the semiconductor chips 20 externally, such that the potting compound 11 forms at least one side face 23 of the semiconductor chips 20. As a result of removal of the electroplating 10 adjoining the potting compound 11 from the dicing trenches 17, the side faces 23 may in particular display traces 24 of material removal using a chemical method. The traces 24 differ in this case from other methods such as for example sawing in particular in that the $SiO_2$ particles contained in the potting compound 11 wholly retain their spherical shape, and therefore in particular remain whole.

Alternatively, instead of removing the complete dicing strip, it is possible for example to remove just one of the starting layer 8 arranged in this region and the electroplating 10, for example using one of the above-stated wet chemical methods. In a further step, the remaining part of the dicing strip may for example be severed by another dicing method, such that the composite structure 1 is singulated into semiconductor chips 20.

A second exemplary embodiment (FIG. 2) differs from the first exemplary embodiment described in connection with FIGS. 1a to 1h in that a side face of the semiconductor layer sequence 2, 3 delimiting the dicing trenches 17 comprises a step 19. The intermediate method step shown in FIG. 2 otherwise corresponds to the intermediate method step of the first exemplary embodiment shown in FIG. 1a. Advantageously, the stepped structure gives the semiconductor layer sequence 2, 3 an increased mechanical loading capacity on detachment of the carrier 4 (cf. FIG. 1f) compared with the first exemplary embodiment. In particular, this prevents cracking in this region of the semiconductor chip 20.

Figure 2:
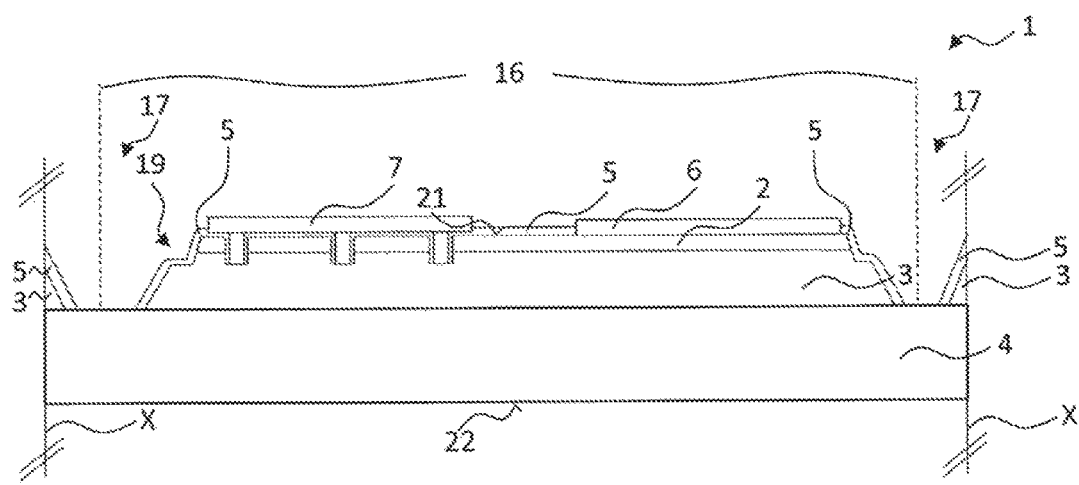
FIG. 2 is a schematic sectional view of an intermediate method step of a method for producing a plurality of semiconductor chips according to a second exemplary embodiment.
Figure 3:
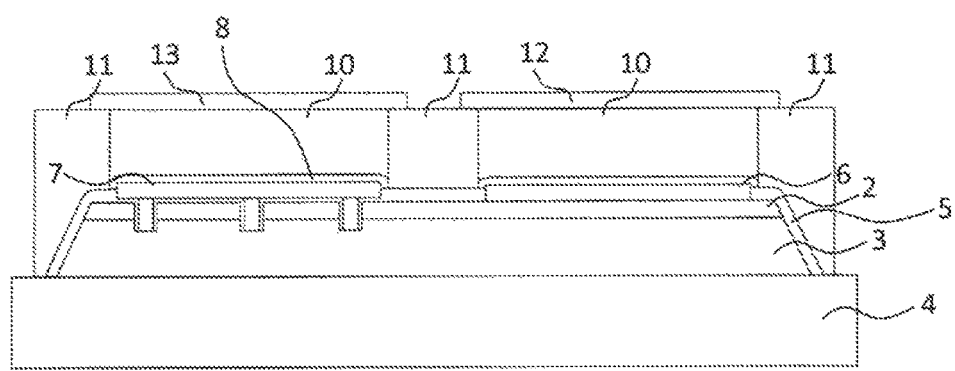
FIG. 3 is a schematic sectional view of an intermediate method step of a method for producing a plurality of semiconductor chips according to a third exemplary embodiment.

A third exemplary embodiment (FIG. 3) differs from the first exemplary embodiment described in connection with FIGS. 1a to 1h and the second exemplary embodiment described in connection with FIG. 2 in that the dicing strips are at least partly removed prior to application of the composite structure 1 to the auxiliary carrier 14. The method according to the third exemplary embodiment corresponds to the method according to the first or second exemplary embodiment right down inclusively to the intermediate method step shown in FIG. 1e. Then the dicing strips in this region are removed (cf. FIG. 1h). Advantageously, the connection contacts 12, 13 may serve in this connection as etch protection for the electroplating 10 during removal of the electroplating 10 from the dicing trenches 17.

Unlike in the intermediate method step shown in FIG. 1h, the semiconductor chips 20 however still form the composite structure 1 with the carrier 4. Singulation of the composite structure 1 accordingly proceeds only thereafter through detachment of the carrier 4 (cf. FIG. 1f).

Advantageously, in this connection the carrier 4 is of patterned construction, such that roughening of the semiconductor layer sequence 2, 3 can be omitted (cf. FIG. 1g). Alternatively, the potting compound 11 may for example be resistive with regard to a method used for roughening. The method according to the first or second exemplary embodiment has the advantage over the method according to the third exemplary embodiment that the potting compound 11 is protected by the dicing strips from an etching process used for roughening. Furthermore, the mechanical loading capacity of the composite structure 1 on detachment of the carrier 4 is higher according to the first or second exemplary embodiment.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS

1 Composite structure
2, 3 Semiconductor layer sequence
4 Carrier
5 Insulation layer
6, 7 Contact plates
8 Starting layer
9 Resist
10 Electroplating
11 Potting compound
12, 13 Connection contact
14 Auxiliary carrier
16 Singulation pattern
17 Dicing trench
18 Roughening
19 Step
20 Semiconductor chip
21, 22 Major faces
23 Side face
24 Traces
X Section line

The invention claimed is:

1. Method of producing a plurality of semiconductor chips, having the method steps:
   a) providing a composite structure, which comprises a carrier and a semiconductor layer sequence;
   b) forming dicing trenches in the semiconductor layer sequence along a singulation pattern;
   c) applying a filling layer delimiting the semiconductor layer sequence relative to the dicing trenches on a side of the semiconductor layer sequence remote from the carrier;
   d) applying a metal layer, adjoining the filling layer, in the dicing trenches; and
   e) singulating the semiconductor chips by removing the metal layer adjoining the filling layer from the dicing trenches;
      wherein the singulated semiconductor chips each comprise one part of the semiconductor layer sequence and the filling layer, and wherein the composite structure is attached to an auxiliary carrier prior to singulation and the semiconductor chips are present in a geometric arrangement on the auxiliary carrier after singulation.

2. Method according to claim 1,
in which in step d) the metal layer is additionally applied on a side of the filling layer remote from the dicing trenches on a side of the semiconductor layer sequence remote from the carrier.

3. Method according to claim 1,
in which the metal layer is applied at least in part by an electroplating method.

4. Method according to claim 1,
in which the metal layer adjoining the filling layer is removed from the dicing trenches using a chemical method.

5. Method according to claim 1,
in which the dicing trenches are formed using a chemical method.

6. Method according to claim 1,
in which, after step b), the dicing trenches extend right through the semiconductor layer sequence.

7. Method according to claim 1,
in which detachment of the carrier is performed in an additional step.

8. Method of producing a plurality of semiconductor chips, having the method steps:
   a) providing a composite structure, which comprises a carrier and a semiconductor layer sequence;
   b) forming dicing trenches in the semiconductor layer sequence along a singulation pattern;
   c) forming dicing strips by applying a metal layer in the dicing trenches;
   d) applying a filling layer delimiting the semiconductor layer sequence relative to the dicing trenches on a side of the semiconductor layer sequence remote from the carrier;
   e) removing the dicing strips in the trenches;
   f) attaching the composite structure to an auxiliary carrier; and
   g) singulating the semiconductor chips by removing the carrier, wherein the singulated semiconductor chips each comprise one part of the semiconductor layer sequence and the filling layer, and wherein the semiconductor chips are present in a geometric arrangement on the auxiliary carrier after singulation.

9. Method according to claim 8,
in which the metal layer is applied at least in part by an electroplating method.

10. Method according to claim 8,
in which the metal layer adjoining the filling layer is removed from the dicing trenches using a chemical method.

11. Method according to claim 8,
in which the dicing trenches are formed using a chemical method.

12. Method according to claim 8,
in which, after step b), the dicing trenches extend right through the semiconductor layer sequence.

\* \* \* \* \*